(12) United States Patent
Arslan

(10) Patent No.: US 7,199,737 B2
(45) Date of Patent: Apr. 3, 2007

(54) DISCONNECTING A TIME DISCRETE CIRCUIT FROM A TRACK-AND-HOLD CIRCUIT IN TRACK MODE

(75) Inventor: Erol Arslan, Maarssen (NL)

(73) Assignee: Broadcom Corporation, Irvine, CA (US)

( * ) Notice: Subject to any disclaimer, the term of this patent is extended or adjusted under 35 U.S.C. 154(b) by 171 days.

(21) Appl. No.: 10/857,844

(22) Filed: Jun. 2, 2004

(65) Prior Publication Data

US 2005/0270210 A1    Dec. 8, 2005

(51) Int. Cl.
*H03M 1/00* (2006.01)
(52) U.S. Cl. ...................... 341/122; 341/155
(58) Field of Classification Search ........ 341/122–125, 341/155
See application file for complete search history.

(56) References Cited

U.S. PATENT DOCUMENTS

| | | | | |
|---|---|---|---|---|
| 4,338,665 A | * | 7/1982 | Aono et al. | 341/124 |
| 4,535,318 A | * | 8/1985 | Duryee et al. | 341/155 |
| 4,677,422 A | * | 6/1987 | Naito | 341/122 |
| 5,389,929 A | * | 2/1995 | Nayebi et al. | 341/122 |
| 5,418,533 A | * | 5/1995 | Knierim | 341/122 |
| 6,127,958 A | * | 10/2000 | Chang et al. | 341/122 |
| 6,710,734 B2 | * | 3/2004 | Ono et al. | 341/155 |

* cited by examiner

*Primary Examiner*—Lam T. Mai
(74) *Attorney, Agent, or Firm*—Sterne, Kessler, Goldstein & Fox P.L.L.C.

(57) ABSTRACT

A system and method for an improved analog front-end system is disclosed. By coupling a switch to the output of a track-and-hold circuit and to the input of a time-discrete circuit, such as an analog-to-digital converter, the time-discrete circuit can be disconnected from the track-and-hold circuit during the track mode of the track-and-hold circuit. This improved system reduces the load of the T/H circuit from the full input capacitance of the time-discrete circuit to the smaller parasitics of the switch thereby providing a T/H circuit with lower power consumption and smaller area while maintaining high speed and high accuracy. When the time-discrete circuit is an analog-to-digital converter, the system and method may also include a second shorted switch coupled between the first switch and the analog-to-digital converter for canceling the charge injection of the first switch and thereby enabling the analog-to-digital converter to convert an analog signal to a digital signal during the track phase of the track-and-hold circuit.

47 Claims, 8 Drawing Sheets

710,708

US 7,199,737 B2

DISCONNECTING A TIME DISCRETE CIRCUIT FROM A TRACK-AND-HOLD CIRCUIT IN TRACK MODE

FIELD OF THE INVENTION

The present invention relates generally to the analog front-end of signal processing systems and more specifically to a system and method for disconnecting a time discrete circuit from a track-and-hold circuit in track mode.

BACKGROUND OF THE INVENTION

Broadband communication integrated circuits employ signal processing techniques to make full use of the available bandwidth and signal to noise space that exist over the transmission medium, for example an unshielded twisted pair wire for ADSL or coax cable for cable modems. When partitioning the signal processing task between analog and digital, the system architect tries to put as much of the signal processing functionality in the digital domain. The analog front-end (hereinafter "AFE") on the receiver side is typically a high resolution analog-to-digital convertor (hereinafter "ADC") preceded by a track-and-hold circuit (hereinafter "T/H circuit") or sample and hold circuit (hereinafter "S/H circuit"). The AFE may also comprise a programmable gain amplifier (hereinafter "PGA") in front to make full use of the ADC input range.

A conventional T/H circuit has two modes of operation: a track mode and a hold mode. During track mode, the T/H circuit is designed to track an analog input signal. During hold mode, the T/H circuit is designed at specified intervals to hold at its output the instantaneous value of the input signal. The T/H circuit is particularly useful as a first stage of an analog-to-digital converter. The held values of the input signal are provided as signal samples to a following stage of the ADC, which converts them to an equivalent digital signal.

S/H circuits provide a series of continuous held samples, one immediately after the other without gaps. An S/H circuit may be constructed from a pair of T/H circuits. The track mode of one track-and-hold circuit substantially coincides with the hold mode of the other circuit and the track mode of the other track-and-hold circuit substantially coincides with the hold mode of the one circuit.

The T/H or S/H circuit is often necessary to relax the ADC timing requirements. A S/H circuit samples the input signal only for a very short period of the sample clock and then provides a still signal for the ADC for almost a full clock cycle. A T/H circuit first tracks the input signal and then samples it. Usually tracking and holding takes half of a clock cycle in a T/H circuit, thus leaving less time for the ADC to do the analog to digital conversion. While the rest of the application will refer to T/H circuits, those skilled in the art will realize that the following discussions are also applicable to S/H circuits.

FIG. 1 is a block diagram of part of a prior art analog front end system 100 comprising a T/H circuit 102 and an ADC 104. In current prior art AFE systems, the output of the T/H circuit, Vtho 108, is coupled directly to the input, Vadin 112, of the ADC circuit 104. Because the load of the T/H circuit is the full input capacitance of the ADC, this capacitance must be taken into account for the stability of the T/H circuit 102. The load of the T/H circuit 102 directly determines the power required in the output stage of the T/H circuit 102. Thus, the power consumed at the output of the T/H circuit can be quite significant depending on the size of the load. Moreover, the more power that is consumed by the T/H circuit, the larger the area required by the T/H circuit 102.

FIG. 2 illustrates a conventional T/H circuit. A T/H circuit requires a switch and some memory element, usually a capacitor. A T/H circuit has two modes of operation: a "track mode" and a "hold mode". During the hold mode, the switch in the T/H circuit is opened, and the capacitor remembers the input signal voltage that was there just before the switch opened. When the switch is opened, the output voltage of the T/H remains stable so that the ADC can start converting the output voltage of the T/H circuit into a digital code. During the track mode, the switch in the T/H circuit is closed. Due to the finite impedance charging the capacitance, a certain amount of time is required for the voltage on the capacitor to approach the input signal voltage, after which the out voltage of the T/H circuit will closely track the input signal.

Broadband communication chips use the latest silicon technologies to yield cost-effective products. In such silicon technologies, the power supply voltage is very low, thus restricting the available circuit topologies that can be used to achieve the required performance is all components in an analog front end. Thus, the absolute input voltage range for the ADC is also low. This in turn requires higher absolute accuracy from the ADC which means more area and power. In a lot of A/D architectures, this means higher input capacitance.

Another disadvantage of current prior art systems is the high power consumption at the output stage of the T/H circuit due to the inherent stability requirement of feedback amplifiers. In a feedback architecture such as the two stage amplifier/negative feedback opamp based T/H circuit, stability is important because the ADC can often have a very high input capacitance as explained above. The T/H circuit must on the one hand achieve a very high bandwidth to process the incoming signal at the required clock frequency, and on the other hand it must do that while driving a potentially high load. In order to have no ringing or overshoot, the amplifier should be designed to have about 60 degrees of phase-margin. The latter requires the non-dominant pole to be located at sufficient high frequency, about 4× the dominant pole frequency in most practical cases to achieve sufficient phase margin. This non-dominant pole is usually set by the output stage and its load. So a 4× higher bandwidth then the signal bandwidth is required in the output stage and this in the presence of a large, usually capacitative, load of the ADC.

Thus, it is desirable to provide an analog front end system comprising a T/H circuit and ADC which has low power consumption and a small area at the output stage of the T/H circuit while maintaining high speed and accuracy.

Further limitations and disadvantages of conventional and traditional approaches will become apparent to one of skill in the art, through comparison of such systems with the present invention as set forth in the remainder of the present application with reference to the drawings.

SUMMARY OF THE INVENTION

According to the present invention, these objects are achieved by a system and method as defined in the claims. The dependent claims define advantageous and preferred embodiments of the present invention.

In one embodiment of the present invention, an analog front-end system for a signal processing device comprises a track-and-hold circuit (hereinafter "T/H circuit"), a time-discrete circuit, and a switch coupled to the output of the T/H circuit and to the input of the time-discrete circuit. In another embodiment of the present invention, a method for providing an analog front-end system in a signal processing device comprises the steps of providing a T/H circuit, providing a time-discrete circuit, and providing a switch coupled to the output of the T/H circuit and to the input of the time-discrete circuit. In a preferred embodiment, the T/H circuit is a negative feedback opamp based T/H circuit, and the switch is a high voltage switch. The time-discrete circuit is preferably a circuit that requires a certain voltage at specific time intervals. In a preferred embodiment, the time-discrete circuit is an analog-to-digital converter (hereinafter "ADC").

During track mode of the T/H circuit, the switch is opened to disconnect the time-discrete circuit from the T/H circuit. When the switch is opened during track mode, the present invention advantageously reduces the load for the T/H circuit from the full input capacitance of the time-discrete circuit to the parasitics of the switch which are much smaller than the input capacitance of the time-discrete circuit. As a result, the full input capacitance of the time-discrete circuit no longer affects the stability of the T/H circuit during track mode. Since the size of the load of the T/H circuit directly determines the power consumed in the output stage of the T/H circuit, the reduced load of the present invention during track mode advantageously enables the T/H circuit to operate with much lower power in the output stage while still maintaining high speed and high accuracy. Thus, the present invention advantageously provides a T/H circuit with lower power consumption and a smaller area.

In another embodiment of the present invention, an analog front-end system for a signal processing device comprises a T/H circuit, an ADC, a first switch coupled to the output of the T/H circuit, and a second switch coupled to the first switch and to the input of the ADC. In a preferred embodiment, the second switch is half the size of the first switch. During track mode of the T/H circuit, the first switch is opened to disconnect the ADC from the T/H circuit thereby decreasing the load of the T/H circuit from the full input capacitance of the ADC to the smaller parasitics of the first switch. The second switch is a "dummy" switch which advantageously cancels the charge injection of the first switch. The first switch and the second switch advantageously enable the ADC to convert an analog signal to a digital signal during the track phase of the T/H circuit.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes, steps or components have not been described in detail in order not to unnecessarily obscure the present invention.

The invention generally pertains to the analog front-end of signal processing systems. More specifically, the invention pertains to an improved system and method for combining 1) a track-and-hold circuit (hereinafter "T/H circuit") or a sample-and-hold circuit (hereinafter "S/H circuit") and 2) a time-discrete circuit in an analog front-end system. In one aspect, the invention relates to disconnecting the time-discrete circuit from a T/H circuit during the track mode of the T/H circuit. In this aspect of the invention, a switch coupled to the output of the T/H circuit and to the input of the time-discrete circuit may be used to connect or disconnect the time-discrete circuit from the T/H circuit. In another aspect, the invention relates to disconnecting the time-discrete circuit from an S/H circuit during the track mode of the S/H circuit. In this aspect of the invention, a switch coupled to the output of the S/H circuit and to the input of the time-discrete circuit may be used to connect or disconnect the time-discrete circuit from the S/H circuit. In yet another aspect of the invention, the time-discrete circuit is a circuit requiring a voltage at specific time intervals, such as an analog-to-digital converter (hereinafter "ADC") or a switched capacitor circuit filter. In a further aspect, the invention provides a second "dummy" or shorted switch to cancel the charge injection of the first switch.

Embodiments of the invention are discussed below with references to FIGS. 3 to 9. However, those skilled in the art will readily appreciate that the detailed description given herein with respect to these figures is for explanatory purposes as the invention extends beyond these limited embodiments. Moreover, for simplicity, the remainder of this section will describe the invention with respect to a T/H circuit and an ADC, but one skilled in the art will realize that the principles and features discussed below may be easily applied to any similar T/H or S/H circuit and to any time-discrete circuit load.

Figure 3:
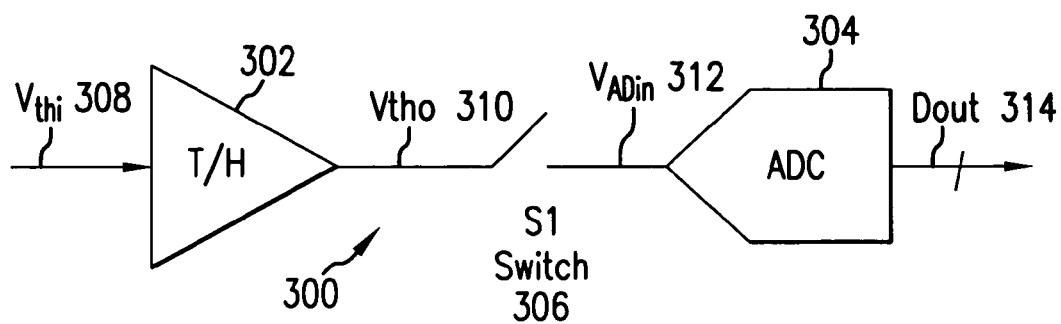
FIG. 3 is a block diagram of one embodiment of the present invention.

FIG. 3 illustrates a block diagram of one embodiment of the present invention. As shown, the present invention 300 includes a T/H circuit 302, an ADC 304, and a switch 306. The T/H circuit 302 is adapted to receive an input $V_{thi}$ 308 and to produce an output $V_{tho}$ 310. In a preferred embodiment, the T/H circuit 302 is a negative feedback opamp based T/H circuit. The ADC 304 is adapted to receive an input $V_{ADin}$ 312 and to produce a digital output $D_{out}$ 314. In a preferred embodiment, the ADC 304 is a full flash converter with 2× interpolation at the input of the comparators and 3× averaging inside two stages of preamplifiers. The switch 306 is coupled to the output of the T/H circuit, $V_{tho}$ 310, and to the input of the ADC, $V_{ADin}$ 312. In a preferred embodiment, the switch 306 is a high voltage switch.

The T/H circuit 302 has two modes of operation: the track mode and the hold mode. In one embodiment of the invention, the switch 306 is opened during track mode thereby disconnecting the T/H circuit 302 from the ADC 304. During track mode, the feedback loop of the T/H circuit 302 is closed, and the T/H circuit output 310 tries to follow the input signal 308. When the ADC 304 is disconnected from the T/H circuit 302 during track mode, the only load on the T/H circuit 302 is itself and the parasitics associated with the open switch 306. In a preferred embodiment, these parasitics are designed to be much smaller than the input capacitance of the ADC 304. Thus, when the ADC 304 is disconnected from the T/H circuit 302 in the track mode, the capacitive load of the T/H circuit 302 is significantly reduced from the full input capacitance of the ADC 304 to only the smaller parasitics of the switch 306.

Thus, when the switch 306 is opened during track mode, the present invention advantageously reduces the load for the T/H circuit 302 from the full input capacitance of the ADC 304 to the parasitics of the switch 306 which are much smaller than the input capacitance of the ADC. As a result, the ADC full input capacitance no longer affects the stability of the T/H circuit during track mode. Since the size of the load of the T/H circuit 302 directly determines the power consumed in the output stage of the T/H circuit 302, the reduced load of the present invention during track mode advantageously enables the T/H circuit 302 to operate with much lower power in the output stage while still maintaining high speed and high accuracy. Thus, the present invention also advantageously provides for a T/H circuit 302 with lower power consumption and a smaller area. One skilled in the art will realize that the present invention is not limited to an ADC, but may also be used with any time-discrete circuit where a voltage is required at specific time intervals. For example, in one embodiment, the present invention may comprise a T/H circuit, a switch, and a switched capacitor circuit.

When the T/H circuit is in hold mode, the switch 306 is closed. In hold mode, the feedback loop of the T/H circuit 302 is open and the output voltage, $V_{tho}$ 310, remains constant. Because the switch 306 between the T/H circuit 302 and the ADC 304 is closed, the ADC 304 "sees" the output signal, $V_{tho}$ 310, of the T/H circuit 302 and can start converting the signal into a digital code during the hold mode of the T/H circuit. As the switch 306 closes, the input capacitance of the ADC 304 is charged from an unrelated previous voltage to the new T/H output voltage. The time required for this ($t_{settle}$) is affected by the output impedance of the T/H circuit and the resistance of the switch 306 when it is in the closed position. Since the input voltage of the ADC has not reached its final value during $t_{settle}$, $t_{settle}$ reduces the time available for the ADC to do the actual analog-to-digital conversion.

Figure 4:
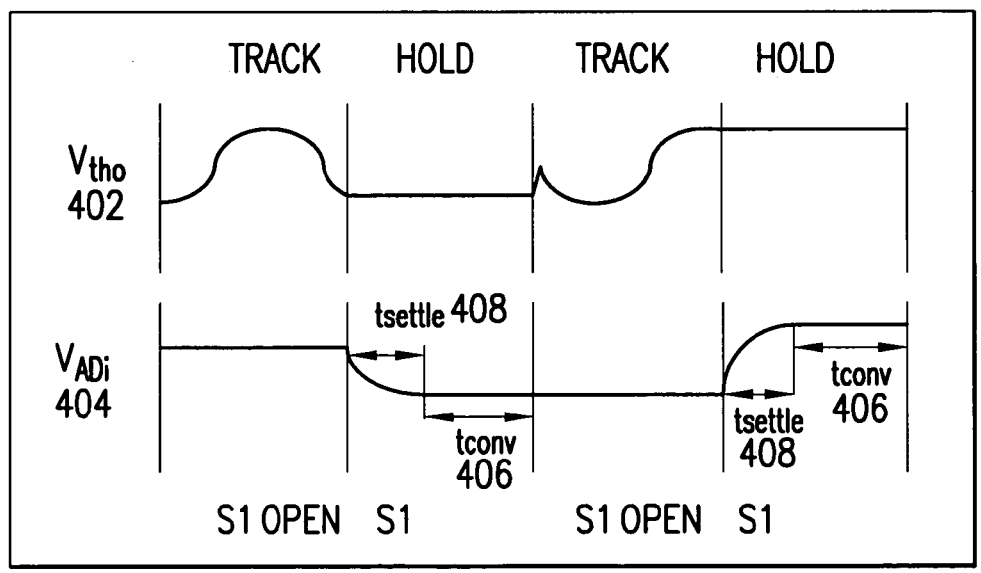
FIG. 4 is a timing diagram of one embodiment of the present invention.

FIG. 4 is a timing diagram illustrating the behavior of $t_{settle}$ due to the impedance of the switch 306 and the input capacitance of the ADC 304. In FIG. 4, the curve 402 illustrates the output voltage of the T/H circuit, $V_{tho}$, during two track and hold phases. The curve 404 illustrates the input voltage of the ADC, $V_{ADin}$, during the same two track and hold phases. As described above, during the track phase, switch 306 is open and during the hold phase, switch 306 is closed. In FIG. 4, it has been assumed for simplicity that the analog to digital conversion by the ADC is performed in a single clock phase. One skilled in the art will realize that other timing cycles are possible and that the present invention is not limited to the conversion time of the ADC. For example, the conversion time, $t_{conversion}$ 406, could also be the input sample phase of an ADC that requires multiple clock cycles for the conversion process. Furthermore, in the present invention, there is no deterioration of the signal by using the switch 306 between the T/H circuit 302 and the ADC 304. If the input impedance of the ADC is mostly capacitive, then there is no error voltage across the switch when the transient current has died away. Charge injection by the switch is dissipated by the T/H circuit on the transition from track to hold phase because the T/H has a very low output impedance.

In one embodiment of the present invention, the analog to digital conversion of the ADC is performed during the track phase of the T/H circuit. When the T/H circuit goes to track mode, its output voltage, $V_{tho}$, will try to track the input signal, but $V_{ADin}$ does not change because the switch 306 opens at the end of the hold phase. Performing the analog-to-digital conversion during the track mode of the T/H circuit may add an extra half clock cycle of latency. In a preferred embodiment, the input capacitance of the ADC, the size of the switch 306, and the accuracy requirements to be met are chosen so that the error due to the charge injection is within acceptable parameters.

Figure 5:
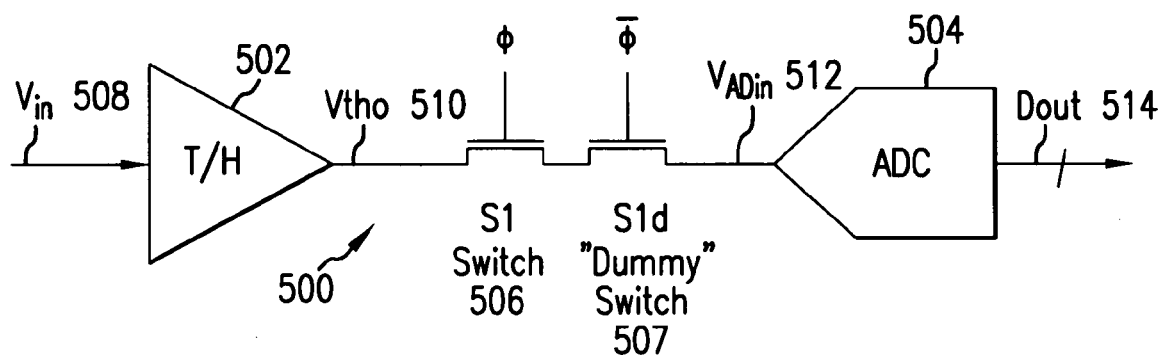
FIG. 5 is a block diagram of another embodiment of the present invention.

FIG. 5 illustrates a block diagram of another embodiment of the present invention. As shown, the present invention includes a T/H circuit 502, an ADC 504, a first switch 506, and a second "dummy" (i.e shorted) switch 507. The T/H circuit 502 is adapted to receive an input $V_{in}$ 508 and to produce an output $V_{tho}$ 510. In a preferred embodiment, the T/H circuit is a negative feedback opamp based T/H circuit. The ADC 504 is adapted to receive an input $V_{ADin}$ 512 and to produce a digital output $D_{out}$ 514. In a preferred embodiment, the ADC is a full flash converter with 2× interpolation at the input of the comparators and 3× averaging inside two stages of preamplifiers. The first switch 506 is coupled to the output of the T/H circuit, $V_{tho}$. The second switch 507 is coupled between the first switch 506 and the ADC 504. The second switch 507 is a "dummy" (i.e shorted) switch which is approximately half the size of the first switch 506 and serves to cancel the charge injection of the first switch 506. In a preferred embodiment, the switches 506 and 507 of the present invention generally have a low ON resistance and low parasitic capacitances. The ON resistance together with the output impedance of the T/H circuit will determine the settling time, $t_{settle}$, assuming the capacitive load is fixed. One skilled in the art will realize that the actual type of switch to fulfill the switch requirements is not limited to any particular type of switch but may be determined by the fabrication technology used, available power supplies, available transistor types, and the signal swings that need to be switched.

The T/H circuit 502 has two modes of operation: the track mode and the hold mode. In one embodiment of the invention, the first switch 506 is opened during track mode thereby disconnecting the T/H circuit 502 from the ADC 504. During track mode, the feedback loop of the T/H circuit is closed, and the T/H circuit output tries to follow the input signal. When the ADC is disconnected from the T/H during track mode, then the only load on the T/H circuit is itself and the parasitics associated with the open switch 506. In a preferred embodiment, these parasitics are designed to be much smaller than the input capacitance of the ADC. Thus, when the ADC is disconnected from the T/H circuit in the track mode, the capacitive load of the T/H circuit is significantly reduced from the full input capacitance of the ADC to only the smaller parasitics of the switch 506.

Thus, when the switch 506 is opened during track mode, the present invention advantageously reduces the load for the T/H circuit from the full input capacitance of the ADC to the parasitics of the switch which are much smaller than the input capacitance of the ADC. As a result, the ADC full input capacitance no longer affects the stability of the T/H circuit during track mode. Since the size of the load of the T/H circuit directly determines the power consumed in the output stage of the T/H circuit, the reduced load of the present invention during track mode advantageously enables the T/H circuit to operate with much lower power in the output stage while still maintaining high speed and high accuracy. Thus, the present invention advantageously provides for a T/H circuit with lower power consumption and a smaller area. The dummy switch advantageously enables the ADC of the present invention to convert an analog signal to a digital signal during the track mode of the T/H circuit.

Figure 6:
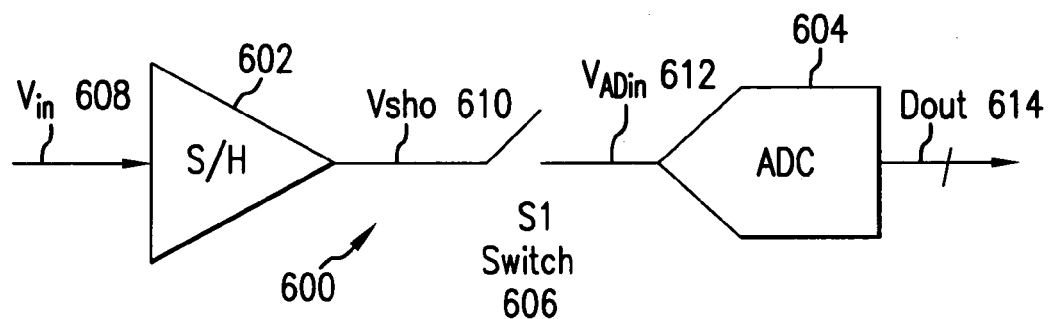
FIG. 6 is a block diagram of yet another embodiment of the present invention.

FIG. 6 illustrates a block diagram of another embodiment 600 of the present invention. As shown, the present invention includes a sample-and-hold circuit 602 (hereinafter "S/H circuit"), an ADC 604, and a switch 606. One skilled in the art will realize that the principles of the present invention discussed above with respect to the T/H circuit can be easily applied to an S/H circuit. The S/H circuit 602 is adapted to receive an input $V_{in}$ 608 and to produce an output $V_{sho}$ 610. The ADC 604 is adapted to receive an input $V_{ADin}$ 612 and to produce a digital output $D_{out}$ 614. The switch 606 is coupled to the output of the S/H circuit, $V_{sho}$, and to the input of the ADC, $V_{ADin}$. When the ADC is disconnected from the S/H, the load on the S/H circuit is itself and the parasitics associated with the open switch 606. In a preferred embodiment, these parasitics are designed to be much smaller than the input capacitance of the ADC. Thus, when the ADC is disconnected from the S/H circuit, the present invention advantageously reduces the load for the S/H circuit from the full input capacitance of the ADC to the parasitics of the switch which are much smaller than the input capacitance of the ADC. As a result, the ADC full input capacitance no longer affects the stability of the S/H circuit when the switch is open. Since the size of the load of the S/H circuit directly determines the power consumed in the output stage of the S/H circuit, the reduced load of the present invention advantageously enables the S/H circuit to operate with much lower power in the output stage while still maintaining high speed and high accuracy.

Figure 7:
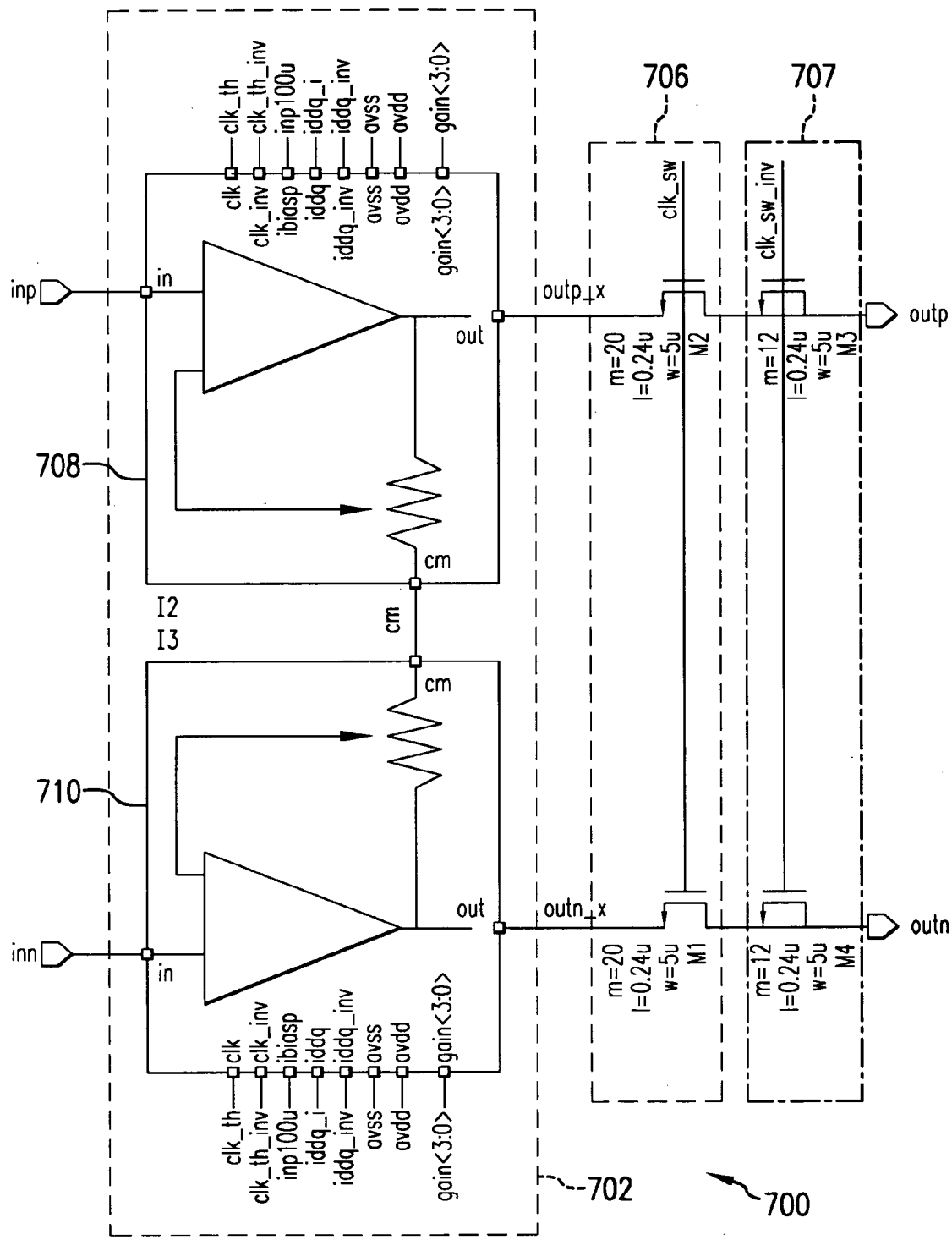
FIG. 7 is a schematic diagram of a T/H circuit, a first switch, and a second switch in accordance with one embodiment of the present invention.

FIG. 7 is a schematic diagram of a T/H circuit 702, a first switch 706, and a second switch 707 in accordance with a preferred embodiment of the present invention. FIG. 7 also includes preferred embodiments of device specifications. The T/H circuit 702 is a negative feedback opamp based T/H circuit. The T/H circuit 702 comprises two identical single-ended T/H circuits, 708 and 710, to achieve a fully differential T/H circuit. The internal schematic of 708 and 710 are depicted below in FIG. 8. First switch 706 is preferably a high voltage switch. The second switch 707 is approximately half the size of the first switch 706 and is a shorted switch with the shorted two sides of the switch tied to one side of the first switch 706 and to the side of the capacitive load. The second switch 707 is driven by the inverse clock of the first switch 706 to achieve the canceling effect. The switches 706, 707 are implemented in this particular case as high-voltage transistors with their gates connected to a 2.5V power supply in the ON state. The output voltage of the T/H circuit is always lower than its power supply voltage of 1.2V. Thus, the switch will have a large Vgs (gate-to-source voltage) when it is on for all output voltages of the T/H circuit. Thus, the present invention advantageously enables a small $R_{switch=ON}$ with a relatively small switch. As a result, the parasitic capacitance of the switches will be small and a lower $R_{switch=ON}$ means a faster settling time when the switch is turned ON.

During track mode, the first switch 706 is opened to disconnect the capacitive load associated with the ADC which is typically on the order of ±3 pF. In one embodiment of the T/H circuit shown in FIG. 7, the power consumption of the T/H circuit is approximately 3.3 mA and $V_{tho}$ is about 0.74V common-mode with a swing of 800 m Vpeak-to-peak differential around that common-mode voltage. The single-ended voltage that each switch has to carry is 0.54V and 0.94V. $V_{thi}$ is about 400 mV common-mode with a 275 mVpeak-to-peak differential swing.

Figure 1:
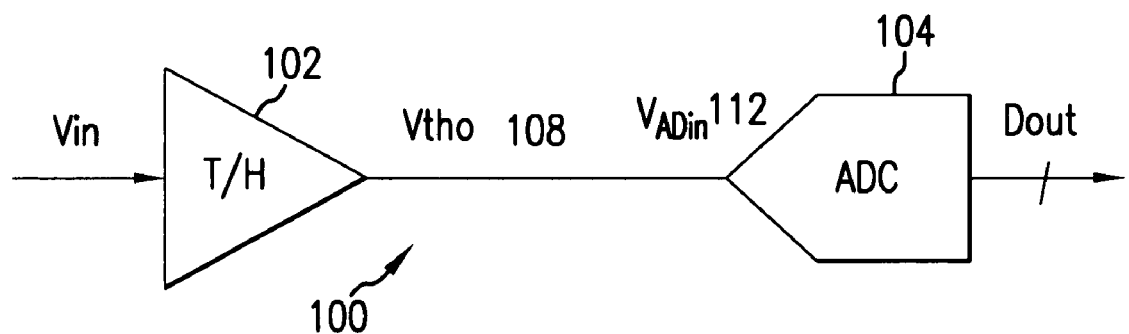
FIG. 1 is a block diagram of a prior art analog front-end system
Figure 2:
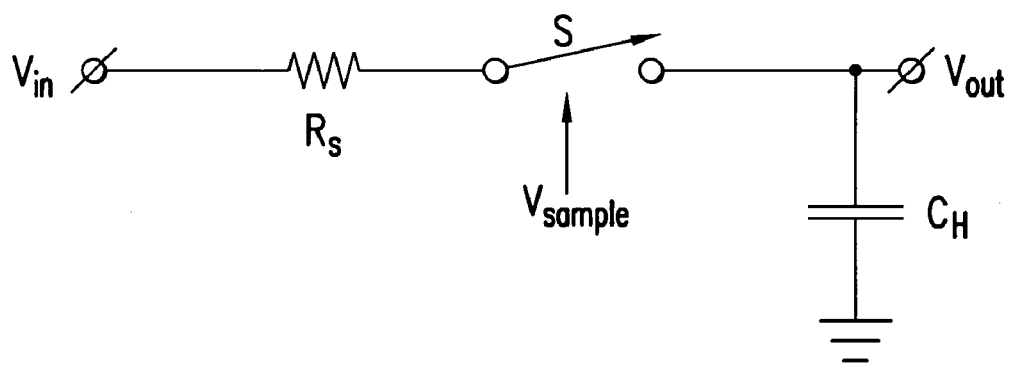
FIG. 2 is a schematic diagram of a prior art track-and-hold circuit.
Figure 8A:
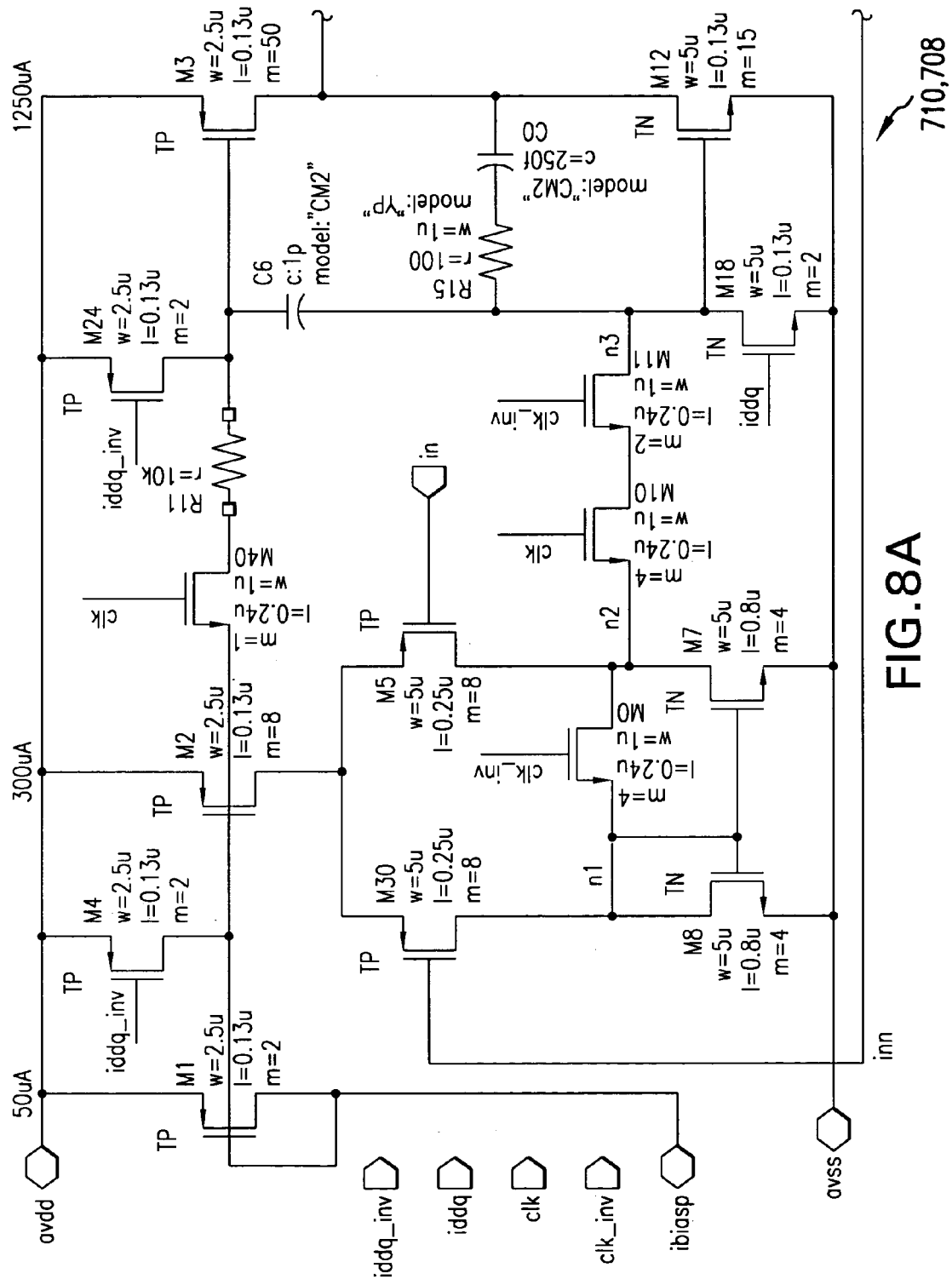
FIG. 8 is a schematic diagram of components of the T/H circuit.
Figure 8B:
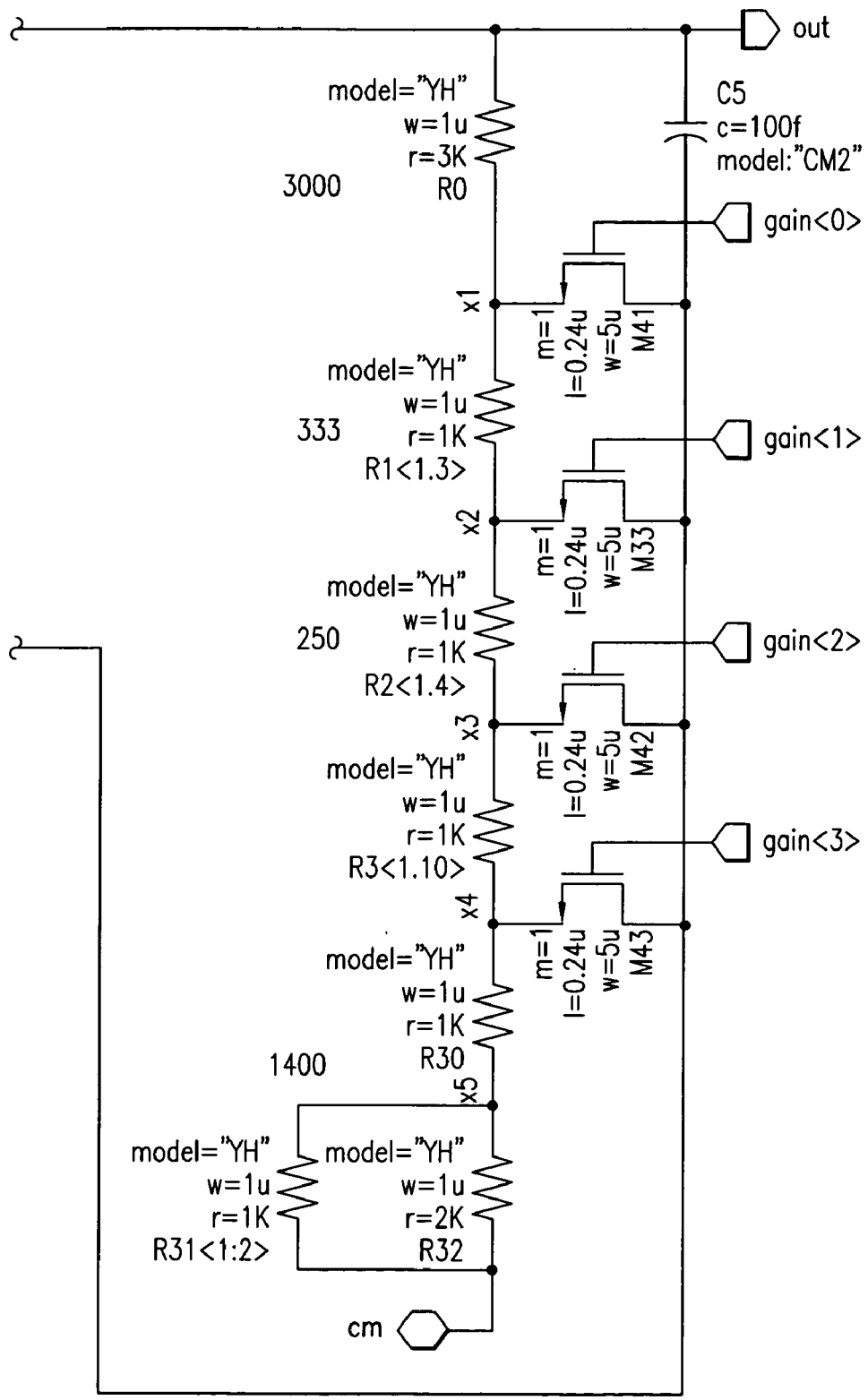
Figure 8C:
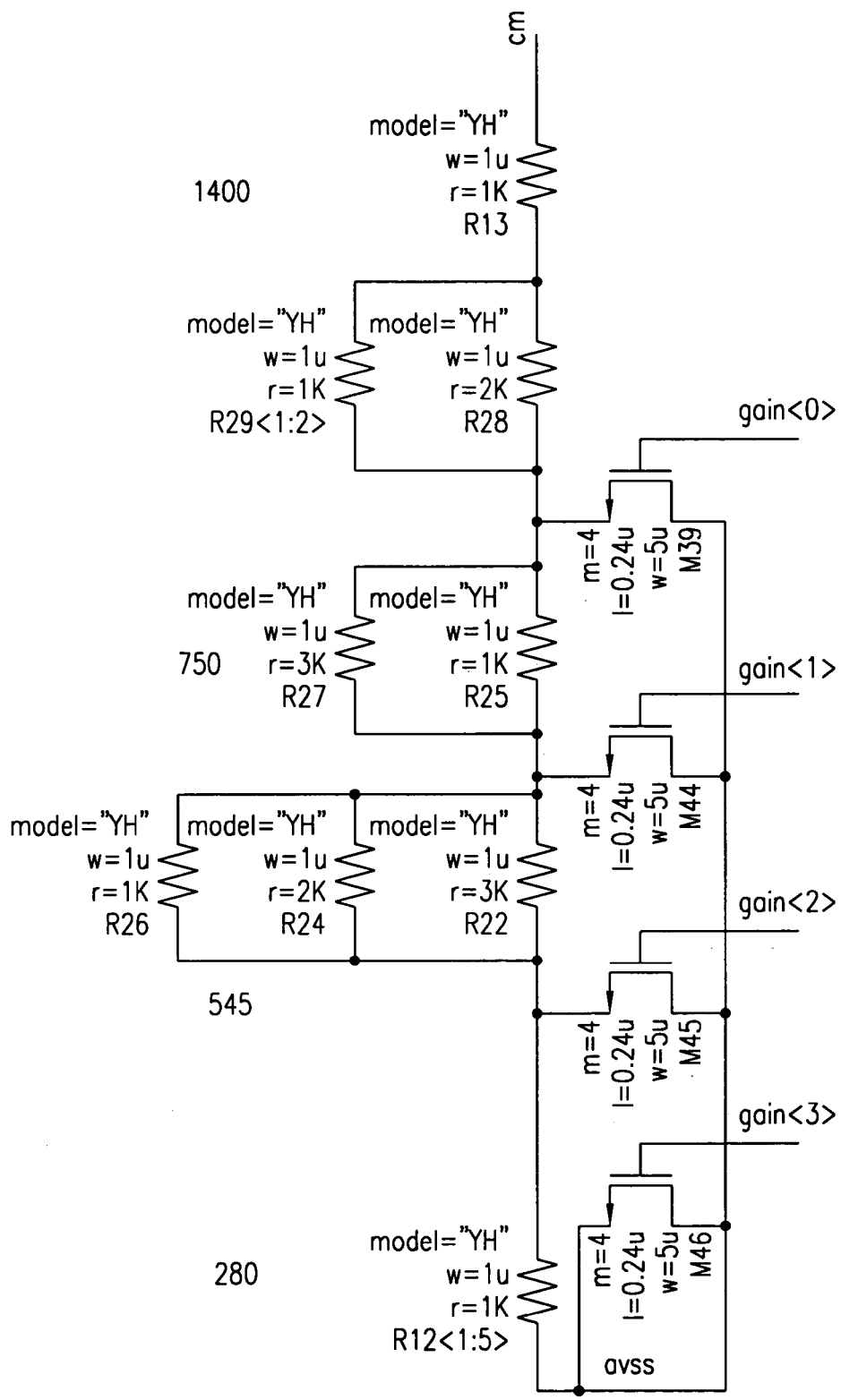

FIG. 8 is a schematic diagram of one single-ended T/H circuit, 708 or 710, used to achieve a fully differential track-and-hold circuit in accordance with a preferred embodiment of the present invention. FIG. 8 also includes preferred embodiments of device specifications. The single-ended track-and-hold circuit that is used to construct a fully differential one is based on a standard T/H architecture. When the track/hold switch M10 is closed, the circuit is configured as a two stage negative feedback opamp amplifier in non-inverting configuration. The opamp itself consists of two amplifier stages. The input stage is a differential pair amplifier (M30 and M5) with a current mirror (M8 and M7) as load. The output of this stage is then coupled through switch M10 to the second amplifier stage. This amplifier is a transistor configured as common-source amplifier (M12). The second amplifier has a capacitor (C0) over it so that the first stage transconductance combined with this C0 times the gain of the second amplifier creates a dominant pole for the total opamp. The configuration where C0 is placed between the input and output of an amplifier to see a much larger capacitance as input impedance is known in the art as the "Miller effect". The track/hold switch M10 is placed at a node where there is a small signal swing. It is immediately apparent to one skilled in the art that the second amplifier stage has a gain of about 10 (typically) so the signal swing at the input of the second amplifier stage will be 10 times smaller then the output swing of the T/H circuit. This is very advantagous because this means that the charge inside the switch M10 is 10 times less signal dependant, so any charge-injection from M10 will give much lower distortion then just a switch only implementation as illlustrated in FIG. 2. When M10 opens, the T/H is in HOLD mode as the loop of the non-inverting ompamp amplifier configuration is opened. The capacitance C0 will retain any voltage that was on it just before switch M10 is opened. The result is that the output voltage of the T/H circuit stops following the (amplified) input voltage but stands still (=HOLD mode).

Figure 9:
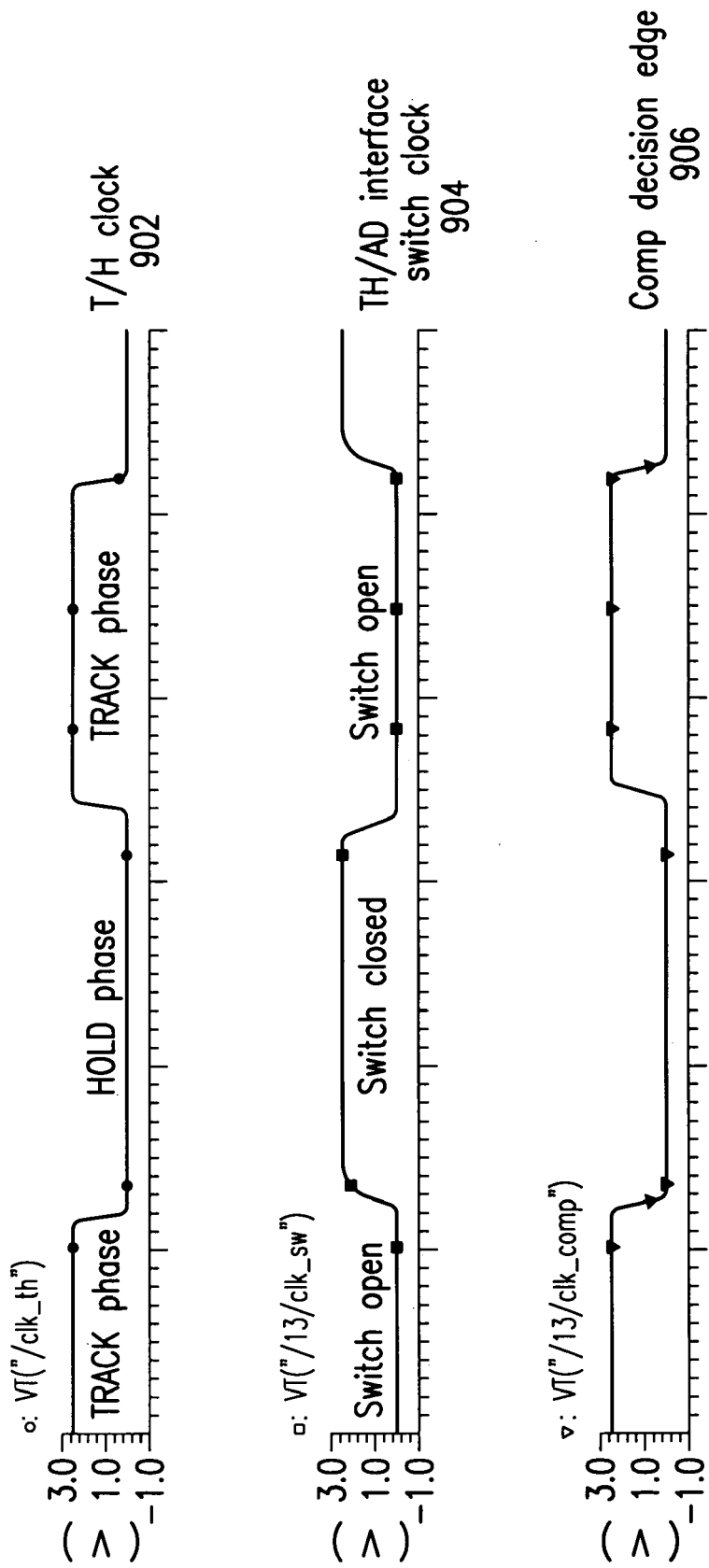
FIG. 9 is a timing diagram of one embodiment of the present invention.

FIG. 9 is a timing diagram of one embodiment of the present invention. The timing diagram illustrates the timing signals of a T/H clock 902, the timing signals of the switch at the T/H and ADC interface 904, and the comparative decision edge of the ADC 906. As shown in FIG. 9, all edges occur after the clock for the T/H circuit goes from 1 to 0 (i.e. from track to hold). In other words, the switch is open during the track phase of the T/H circuit and closed during the hold phase of the T/H circuit. More specifically, as shown in diagrams 902 and 904, the switch is opened slightly before the track phase of the T/H circuit. This is to ensure that the accuracy of the signal at the switch output is not deteriorated by sampling a T/H output that is already switched to track mode. If the switch were opened after the T/H has switched to track mode then the ADC would be sampling a varying input signal on the switch output. Depending on the exact conditions a moderate amount of overlap might be tolerated though at the expense of some accuracy loss. A possible advantage might be a simpler (lower area or lower cost) clocking circuit.

As shown in diagrams 902 and 904, the switch is closed slightly after the hold phase of the T/H circuit has already begun. This is to ensure that the T/H is not loaded with the full A/D (or other circuit) input capacitance through the switch while it is still in feedback configuration. If this occurs the phase margin of the T/H is reduced a lot and possibly negative so ringing or even actual oscillation might occur before the T/H goes into hold mode. This would inevitably degrade the performance of the T/H circuit. Depending on the exact conditions a moderate amount of overlap might be tolerated though at the expense of some accuracy loss. A possible advantage might be a simpler (lower area or lower cost) clocking circuit. As shown in diagram 906, the ADC will sample its input in the hold phase and will decide what the input voltage is and what digital code to output. During this operation, the switch is closed.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An analog front-end system for a communication device comprising:
   a track-and-hold circuit;
   an analog-to-digital circuit;
   a switch coupled to an output of the track-and-hold circuit and to an input of the analog-to-digital circuit; and
   wherein the switch is opened during a track mode of the track-and-hold circuit to disconnect the analog-to-digital circuit from the track-and-hold circuit.

2. The system of claim 1 wherein the track-and-hold circuit is a negative feedback opamp based track-and-hold circuit.

3. The system of claim 1 wherein the analog-to-digital circuit is a full flash circuit.

4. The system of claim 1 wherein the analog-to-digital circuit converts an analog signal to a digital signal during a track phase of the track-and-hold circuit.

5. The system of claim 1 wherein the analog-to-digital circuit converts an analog signal to a digital signal during a hold mode of the track-and-hold circuit.

6. The system of claim 4 further comprising:
   a second switch coupled to the first switch and to the analog-to-digital circuit for canceling a charge injection of the first switch.

7. The system of claim 6 wherein the second switch is half the size of the first switch.

8. A method for providing an analog front-end system in a signal processing device, the method comprising the steps of:
   providing a track-and-hold circuit;
   providing a time-discrete circuit;
   providing a switch coupled to an output of the track-and-hold circuit and to an input of the time-discrete circuit; and
   opening the switch during a track mode of the track-and-hold circuit to disconnect the time-discrete circuit from the track-and-hold circuit.

9. The method of claim 8 wherein the track-and-hold circuit is a negative feedback opamp based track-and-hold circuit.

10. The method of claim 8 wherein the time-discrete circuit is an analog-to-digital circuit.

11. The method of claim 8 wherein the time-discrete circuit is a switched capacitor circuit.

12. The method of claim 10 wherein the analog-to-digital circuit is a full flash circuit.

13. The method of claim 10 further comprising the step of:
    converting an analog signal to a digital signal during a track phase of the track-and-hold circuit.

14. The method of claim 13 further comprising the step of:
    providing a second switch coupled to the first switch and to an input of the analog-to-digital circuit for canceling a charge injection of the first switch.

15. The method of claim 14 wherein the second switch is half the size of the first switch.

16. An analog front-end system for a communication device comprising:
    a track-and-hold circuit;
    a time-discrete circuit;
    a first switch coupled to an output of the track-and-hold circuit; and
    a second switch coupled to the first switch and to the time-discrete circuit.

17. The system of claim 16 wherein the time-discrete circuit is a switched capacitor circuit.

18. The system of claim 16 wherein the time-discrete circuit is an analog-to-digital circuit.

19. The system of claim 16 wherein the first switch is opened during a track mode of the track-and-hold circuit to disconnect the time-discrete circuit from the track-and-hold circuit.

20. The system of claim 18 wherein the analog-to-digital circuit converts an analog signal to a digital signal during a track phase of the track-and-hold circuit.

21. The system of claim 16 wherein the track-and-hold circuit is a negative feedback opamp based track-and-hold circuit.

22. The system of claim 18 wherein the analog-to-digital circuit is a full flash circuit.

23. The system of claim 16 wherein the second switch is half the size of the first switch.

24. The system of claim 16 wherein the second switch cancels the charge injection of the first switch.

25. An analog front-end system for a communication device comprising:
    a track-and-hold circuit having a track mode of operation wherein an output signal tracks an input signal;
    an analog-to-digital circuit adapted to receive an input from the track-and-hold circuit; and
    a switch coupled to an output of the track-and-hold circuit and to the input of the analog-to-digital circuit; and
    wherein the switch is opened during a track mode of the track-and-hold circuit to disconnect the analog-to-digital circuit from the track-and-hold circuit to decrease a load of the track-and-hold circuit during the track mode.

26. The system of claim 25 wherein the track-and-hold circuit is a negative feedback opamp based track-and-hold circuit.

27. The system of claim 25 wherein the analog-to-digital circuit is a full flash circuit.

28. The system of claim 25 wherein the analog-to-digital circuit converts an analog signal to a digital signal during a track phase of the track-and-hold circuit.

29. The system of claim 28 further comprising:
a second switch coupled to the first switch and to the analog-to-digital circuit for canceling a charge injection of the first switch.

30. The system of claim 29 wherein the second switch is half the size of the first switch.

31. An analog front-end system for a communication device comprising:
a track-and-hold circuit;
a time-discrete circuit;
a switch coupled to an output of the track-and-hold circuit and to the time-discrete circuit; and
wherein the switch is opened during a track mode of the track-and-hold circuit to disconnect the time-discrete circuit from the track-and-hold circuit.

32. The system of claim 31 wherein the track-and-hold circuit is a negative feedback opamp based track-and-hold circuit.

33. The system of claim 31 wherein the time-discrete circuit is an analog-to-digital circuit.

34. The system of claim 31 wherein the time-discrete circuit is a switched capacitor circuit.

35. The system of claim 33 wherein the analog-to-digital circuit converts an analog signal to a digital signal during a track phase of the track-and-hold circuit.

36. The system of claim 31 further comprising:
a second switch coupled to the first switch and to the input of the time-discrete circuit for canceling a charge injection of the first switch.

37. An analog front-end system for a communication device comprising:
a sample-and-hold circuit;
a time-discrete circuit;
a switch coupled to an output of the sample-and-hold circuit and to an input of the time-discrete circuit; and
wherein the switch is opened during a track mode of the sample-and-hold circuit to disconnect the time-discrete circuit from the sample-and-hold circuit.

38. The system of claim 37 wherein the time-discrete circuit is an analog-to-digital circuit.

39. The system of claim 38 wherein the analog-to-digital circuit converts an analog signal to a digital signal during a track phase of the sample-and-hold circuit.

40. The system of claim 37 further comprising:
a second switch coupled to the first switch and to the time-discrete circuit for canceling a charge injection of the first switch.

41. An analog front-end system for a communication device comprising:
a track-and-hold circuit;
a first switch;
a second switch coupled between an output of the track-and-hold circuit and the first switch; and
wherein the first switch counteracts a charge injection of the second switch.

42. An analog front-end system for a communication device comprising:
a sample-and-hold circuit;
a first switch;
a second switch coupled between an output of the sample-and-hold circuit and the first switch; and
wherein the first switch counteracts a charge injection of the second switch.

43. The method of claim 10 further comprising the step of:
converting an analog signal to a digital signal during a hold phase of the track-and-hold circuit.

44. The system of claim 18 wherein the analog-to-digital circuit converts an analog signal to a digital signal during a hold phase of the track-and-hold circuit.

45. The system of claim 25 wherein the analog-to-digital circuit converts an analog signal to a digital signal during a hold phase of the track-and-hold circuit.

46. The system of claim 35 wherein the analog-to-digital circuit converts an analog signal to a digital signal during a hold phase of the track-and-hold circuit.

47. The system of claim 38 wherein the analog-to-digital circuit converts an analog signal to a digital signal during a hold phase of the track-and-hold circuit.

* * * * *